United States Patent
Dakshina-Murthy et al.

(10) Patent No.: US 6,855,627 B1
(45) Date of Patent: Feb. 15, 2005

(54) METHOD OF USING AMORPHOUS CARBON TO PREVENT RESIST POISONING

(75) Inventors: Srikanteswara Dakshina-Murthy, Austin, TX (US); Scott A. Bell, San Jose, CA (US); Richard J. Huang, Cupertino, CA (US); Richard C. Nguyen, Fremont, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 104 days.

(21) Appl. No.: 10/309,923

(22) Filed: Dec. 4, 2002

(51) Int. Cl.[7] .......................................... H01L 21/4763
(52) U.S. Cl. ..................................... 438/624; 438/703
(58) Field of Search ................................. 438/624, 703

(56) References Cited

U.S. PATENT DOCUMENTS

| | | | | |
|---|---|---|---|---|
| 5,946,601 A | * | 8/1999 | Wong et al. ................. | 438/783 |
| 6,159,872 A | * | 12/2000 | Essaian et al. .............. | 438/787 |
| 6,265,779 B1 | * | 7/2001 | Grill et al. ................... | 257/759 |
| 6,333,255 B1 | * | 12/2001 | Sekiguchi .................... | 438/622 |
| 6,455,417 B1 | * | 9/2002 | Bao et al. .................... | 438/637 |
| 6,599,838 B1 | * | 7/2003 | Shih et al. ................... | 438/692 |
| 6,764,949 B2 | * | 7/2004 | Bonser et al. ............... | 438/666 |
| 6,803,313 B2 | * | 10/2004 | Gao et al. .................... | 438/680 |
| 2003/0091938 A1 | * | 5/2003 | Fairbairn et al. ........... | 430/314 |
| 2004/0018738 A1 | * | 1/2004 | Liu ............................. | 438/700 |
| 2004/0061227 A1 | * | 4/2004 | Gao et al. .................... | 257/750 |
| 2004/0079726 A1 | * | 4/2004 | Tabery et al. ................. | 216/58 |
| 2004/0087139 A1 | * | 5/2004 | Yeh et al. .................... | 438/636 |

* cited by examiner

Primary Examiner—W. David Coleman
(74) Attorney, Agent, or Firm—Foley & Lardner LLP

(57) ABSTRACT

An exemplary embodiment relates to a method of using an amorphous carbon layer to prevent photoresist poisoning. The method includes doping a first amorphous carbon layer located above a substrate, providing an oxide layer above the first amorphous carbon layer where the oxide layer has a pinhole, and providing a second amorphous carbon layer adjacent to the oxide layer. The second amorphous carbon layer is undoped and the second amorphous carbon layer helps prevent photoresist poisoning.

20 Claims, 3 Drawing Sheets

US 6,855,627 B1

METHOD OF USING AMORPHOUS CARBON TO PREVENT RESIST POISONING

FIELD OF THE INVENTION

The present disclosure relates generally to integrated circuits and methods of manufacturing integrated circuits. More particularly, the present disclosure relates to a method of using amorphous carbon to prevent resist poisoning.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS).

In the fabrication of devices on a wafer substrate, such as silicon, to form an IC, various metal layers and insulation layers can be deposited thereon. Insulation layers, such as, silicon dioxide, silicon oxynitride, fluorinated silicate glass (FSG), and spin-on glass (SOG) can provide electrical insulation between metal layers. The insulation layers can be protective layers or gap filling layers to achieve planarization in the wafer substrate. Insulation layers can be deposited by conventional technique such as plasma enhanced chemical vapor deposition (PECVD) and atmospheric pressure CVD.

Conventionally, a first level metal layer is separated by one or more insulation layers from a second level metal layer. This second level metal layer may be separated by one or more further insulation layers from a third level metal layer. These metal layers include conductive lines that can be interconnected through vias or small holes or apertures etched in the intervening insulation layers.

In order to interconnect stacked layers, the stacked layers undergo photolithographic processing to provide a pattern and form vias. The top layer on the wafer substrate is covered with a photoresist layer of photo-reactive polymeric material for patterning via a mask. Light, such as, visible or ultraviolet (UV) light is directed through the mask onto the photoresist layer to expose it in the mask pattern. The polymeric material of the photoresist layer is transparent to the light yet photo-reactive to change its chemical properties, thereby permitting its patterning.

An antireflective coating (ARC) layer such as an organic ARC layer, can be provided between the photoresist layer and the top layer on the wafer substrate to minimize reflection of light back to the photoresist layer for more uniform patterning. The thickness and material of the ARC layer are chosen to reduce reflection in accordance with lithographic parameters, such as wave length of light.

The photoresist may be of negative or positive type. In a negative photoresist, the exposed (polymerized) areas become insoluble while the unexposed (unpolymerized) areas dissolve in a later applied developer liquid. In a positive photoresist, the exposed (degraded) soluble areas dissolve in the developer liquid while the unexposed (insoluble) areas remain. In both instances, the photoresist material remaining on the wafer substrate forms the pattern to serve as a mask for etching in turn of the pertinent layers. Resist poisoning is a phenomenon that affects chemically amplified resists which are generally of a positive type.

Etching processes are selective to particular types of materials with respect to other types of materials. For example, when etching via holes through a dielectric material, the etching process is selective to the dielectric material with respect to layers underlying the dielectric material. Generally, it is desirable to use anisotropic etching processes (etching processes with a high rate vertical direction etching and low rate or inhibited horizontal direction etching). Anisotropic etching processes are distinguished from isotropic etching processes (processes that etch the exposed surfaces equally in all directions). Anistropic etching processes generally attempt to provide an etched structure of uniform vertical wall geometry or profile. Etching processes can be manifested as wet etching (solution) or dry etching (plasma etching or reactive ion etching) techniques, depending on the physical and chemical characteristics of the material being etched and of the neighboring material.

For maximizing the integration (connection) of device components in the available area oh the wafer substrate to fit more components in the same area, increasing miniaturization is required. As narrower metal lines and closer pitch dimensions are needed to achieve increasingly dense packing of the components, they become more vulnerable to defects at the minute tolerances involved. This has become apparent as IC miniaturization has increased to very large scale integration (VLSI) at sub-quarter micron and smaller dimensions.

Contaminants that are incompatible with the photoreactive material can migrate into the photoresist layer from the ARC layer or other layer. These contaminants can poison the photoresist layer, causing non-uniformity of the reaction therein by extraneous chemical interaction with the polymeric material. This phenomenon is commonly called "photoresist poisoning" and leads to the formation of a photoresist footing where a positive photoresist is us ed, or to a photoresist pinching where a negative photoresist is used.

A disadvantage of common ARC layers (e.g., silicon oxynitride films) lies in their incompatibility with modern DUV (deep UV) photoresist systems due to reactive contaminants that are present therein. These reactive nitrogen substances tend to migrate or diffuse out of the silicon oxynitride layer and chemically interact with constituents of the photoresist layer.

As described above, such chemical interaction, commonly called photoresist poisoning, leads to photoresist footing or photoresist pinching. The photoresist footing or photoresist pinching problem leads to imperfect transfer of the photoresist pattern to the underlying substrate and ultimately limits the minimum spatial resolution of IC components.

Small holes or "pinholes" in insulating layers, such as silicon oxide nitride (SiON), can serve to facilitate resist poisoning. Accordingly, detecting pinholes early in development is important. Nevertheless, some pinholes are too small for many conventional state-of the-art defect inspection tools to capture. Further, in the effort to make smaller and smaller transistors, the effects of small defects (e.g., small pinholes) increase in importance.

Resist poisoning typically occurs due to neutralization of photogenerated H+ by nitrogen species from substrate materials (or by atmospheric trace amine contaminants). Limiting contact with basic layers helps avoid resist poisoning. Although the basic layer is typically separated from the photoresist by an oxide layer, if a pinhole is present in the oxide layer, the basic layer may neutralize photoresist via the pinhole. The self-catalyzed deprotection of resist polymer backbone cannot occur when the mobile deprotecting H+ species are neutralized by basic contaminants. Hence, resist is not rendered base soluble and remains intact in such locations, leading to "poisoning". As such, poisoned resist can remain over the oxide layer defect. The poisoned resist can result in a polysilicon micromask.

Thus, there is a need to prevent resist poisoning when using a basic layer. Further, there is a need to use an undoped layer of amorphous carbon to prevent resist poisoning from nitrogen from N-doped amorphous carbon through pinholes in a cover layer. Even further, there is a need to reduce defects formed while using doped amorphous carbon to pattern integrated circuit features.

SUMMARY OF THE INVENTION

An exemplary embodiment relates to a method of using an amorphous carbon layer to prevent photoresist poisoning. The method includes doping a first amorphous carbon layer located above a substrate, providing an oxide layer above the first amorphous carbon layer where the oxide layer has a pinhole, and providing a second amorphous carbon layer adjacent to the oxide layer. The second amorphous carbon layer is undoped and the second amorphous carbon layer helps prevent photoresist poisoning.

Another exemplary embodiment relates to a method of preventing photoresist poisoning using an undoped amorphous carbon layer. The method includes providing a doped amorphous carbon layer above a substrate, providing a SiON layer above the doped amorphous carbon layer, and providing an undoped amorphous carbon layer above the doped amorphous carbon layer.

Another exemplary embodiment relates to a method of preventing resist poisoning. The method includes providing a doped basic layer above a substrate, providing an oxide layer above the doped basic layer, and forming an undoped layer along the oxide layer.

Other principal features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DETAILED DESCRIPTION OF THE EXEMPLARY EMBODIMENTS

Figure 1:
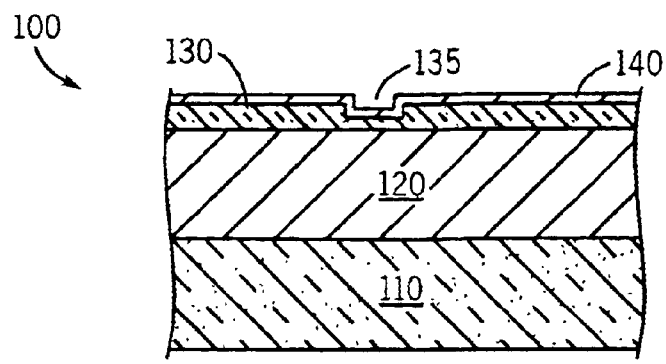
FIG. 1 is a schematic cross-sectional view representation of a portion of an integrated circuit showing a pinhole and an undoped amorphous carbon cover layer in accordance with an exemplary embodiment.

Referring to FIG. 1, a portion 100 of an integrated circuit includes a substrate 110, a doped amorphous carbon layer 120, an oxide layer 130, and an undoped amorphous carbon layer 140. Substrate 110 can include at least one layer, such as a layer of polysilicon or multiple layers.

Doped amorphous carbon layer 120 is typically nitrogen doped. Doped amorphous carbon layer 120 can have a cross-sectional thickness of approximately 400–800 Angstroms. In an exemplary embodiment, doped amorphous carbon layer 120 can be deposited using a chemical vapor deposition (CVD) process and can be doped at a concentration of 3–9%.

Oxide layer 130 can include silicon oxide nitride (SiON) and can have a cross-sectional thickness of approximately 200 Angstroms. In an exemplary embodiment, oxide layer 130 includes a defect, such as a pinhole 135. Pinhole 135 can be a depression or an aperture in oxide layer 130. Pinhole 135 can have a cross-sectional thickness of 0 to 30 Angstroms. Pinhole 135 can expose doped amorphous carbon layer 120 to layers above oxide layer 130. With such an exposure, for example, it is possible for elements in doped amorphous carbon layer 120 to poison a photoresist layer.

Undoped amorphous carbon layer 140 can be provided conformally above oxide layer 130 and pinhole 135. In an exemplary embodiment, undoped amorphous carbon layer 140 can be provided using a chemical vapor deposition (CVD) process. Undoped amorphous carbon layer 140 can have a thickness of approximately 100 Angstroms or less.

Figure 2:
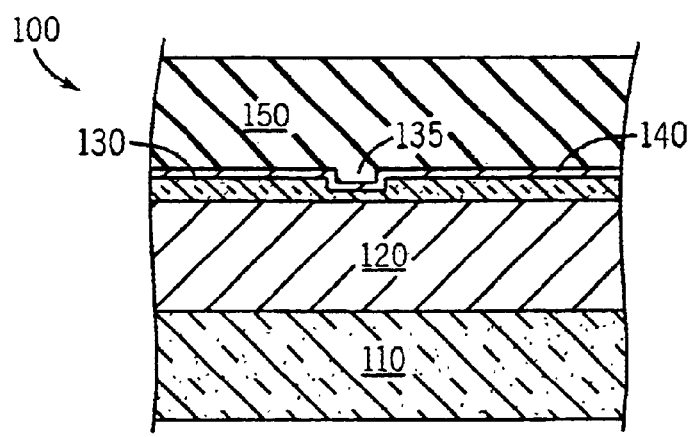
FIG. 2 is a schematic cross-sectional view representation of the portion of the integrated circuit of FIG. 1, showing a resist application operation in accordance with an exemplary embodiment.

FIG. 2 illustrates portion 100 after application of a resist layer 150. Resist layer 150 can be deposited above undoped amorphous carbon layer 140 using any of a variety of different techniques. For example, resist layer 150 can be deposited using a spin coating operation. Resist layer 150 can have a cross-sectional thickness of 1000–4000 Angstroms.

Advantageously, undoped amorphous carbon layer 140 provides a barrier between doped amorphous carbon layer 120 and resist layer 150. As such, the photo generated acid ($H^+$) does not get neutralized by N-dopants in doped amorphous carbon layer 120. Accordingly, resist poisoning is avoided.

Figure 3:
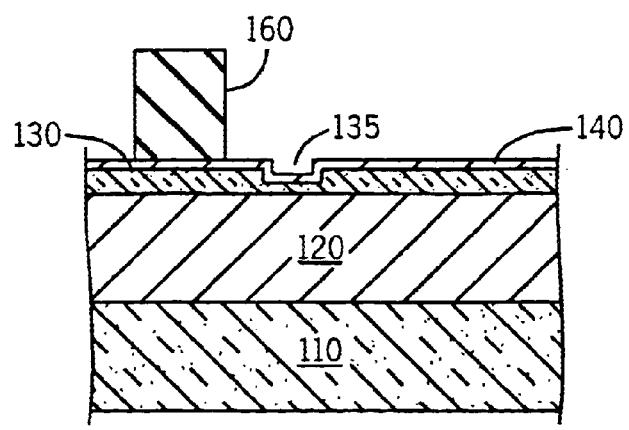
FIG. 3 is a schematic cross-sectional view representation of the portion of the integrated circuit of FIG. 1, showing a patterning operation.

FIG. 3 illustrates portion 100 after a patterning operation in which resist layer 150 is patterned from a feature 160. Resist feature 160 can be used in the patterning of doped amorphous carbon layer 120 to form a gate structure. In an exemplary embodiment, feature 160 has a cross-sectional width of 80–200 nm. Advantageously, no defect (i.e., resist extra pattern or undeveloped resist) is present proximate pinhole 135 because resist poisoning was prevented by the use of undoped amorphous carbon layer 140.

Figure 4:
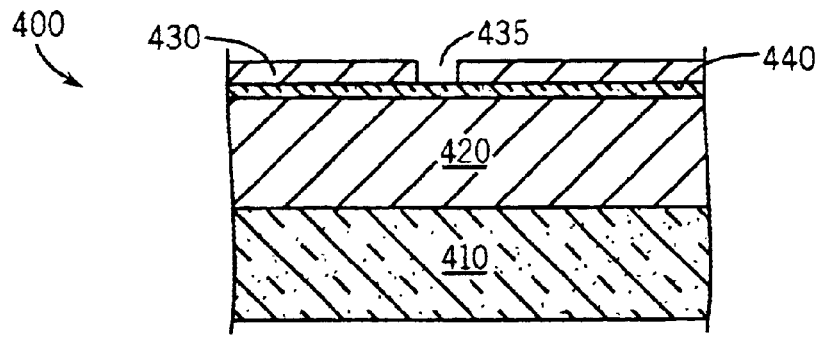
FIG. 4 is a schematic cross-sectional view representation of a portion of an integrated circuit showing a pinhole and an undoped amorphous carbon under layer in accordance with another exemplary embodiment.

FIG. 4 illustrates a portion 400 of an integrated circuit. Portion 400 can include a substrate 410, a doped amorphous carbon layer 420, an oxide layer 430, and an undoped amorphous carbon layer 440. Substrate 410 can include at least one layer, such as a layer of polysilicon or multiple layers.

Doped amorphous carbon layer 420 can be doped during deposition with nitrogen. Doped amorphous carbon layer 420 can have a cross-sectional thickness of approximately 400–800 Angstroms. In an exemplary embodiment, doped amorphous carbon layer 420 can be deposited using a chemical vapor deposition (CVD) process and can be doped at a concentration of 3–9%.

Undoped amorphous carbon layer 440 can be provided conformally above doped amorphous carbon layer 420. In an exemplary embodiment, undoped amorphous carbon layer 440 can be provided using a chemical vapor deposition (CVD) process. Undoped amorphous carbon layer 440 can have a thickness of approximately 100 Angstroms or less.

Oxide layer 430 can include silicon oxide nitride (SiON) and can have a cross-sectional thickness of approximately 200 Angstroms. In an exemplary embodiment, oxide layer 430 includes a pinhole 435. Pinhole 435 can be a defect or an aperture in oxide layer 430. Pinhole 435 can have a cross-sectional thickness of 0 to 30 Angstroms. Without undoped amorphous carbon layer 440, pinhole 435 would expose doped amorphous carbon layer 420 to layers above oxide layer 430 and could, for example, poison a photoresist layer.

Figure 5:
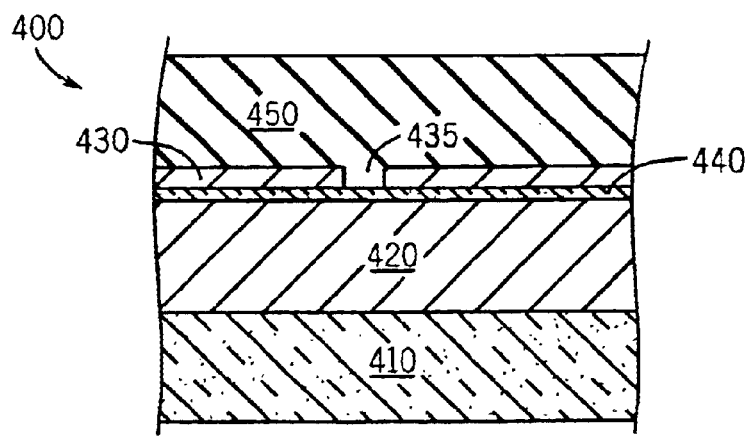
FIG. 5 is a schematic cross-sectional view representation of the portion of the integrated circuit of FIG. 4, showing a resist application operation.

FIG. 5 illustrates portion 400 after application of a resist layer 450. Resist layer 450 can be deposited above oxide layer 430 using any of a variety of different techniques. For example, resist layer 450 can be deposited using a spin coating operation. Resist layer 450 can have a cross-sectional thickness of 1000–4000 Angstroms.

Advantageously, undoped amorphous carbon layer 440 provides a barrier between doped amorphous carbon layer 420 and resist layer 450. As such, the photo generated acid (H+) does not get neutralized by basic species, such as, nitrogen in doped amorphous carbon layer 120. Accordingly, resist poisoning is avoided.

Figure 6:
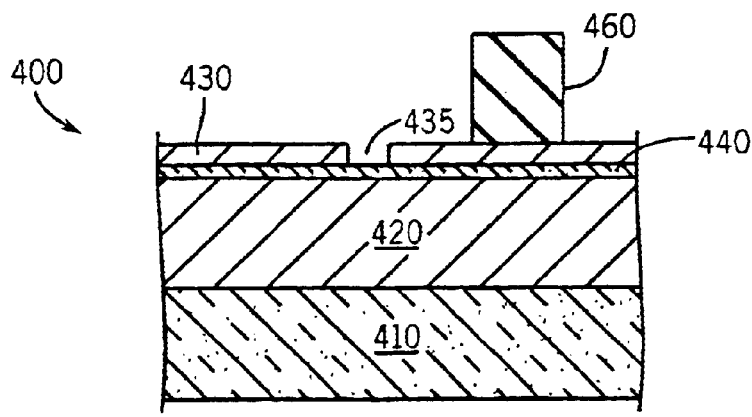
FIG. 6 is a schematic cross-sectional view representation of the portion of the integrated circuit of FIG. 4, showing a patterning operation.

FIG. 6 illustrates portion 400 after a patterning operation in which resist layer 450 is patterned from a feature 460. Resist feature 460 can be used in the patterning of doped amorphous carbon layer 420 to form a gate structure. In an exemplary embodiment, feature 460 has a cross-sectional width of 80–200 nm. Advantageously, no defect is present proximate pinhole 435 because resist poisoning was prevented by the use of undoped amorphous carbon layer 440.

Figure 7:
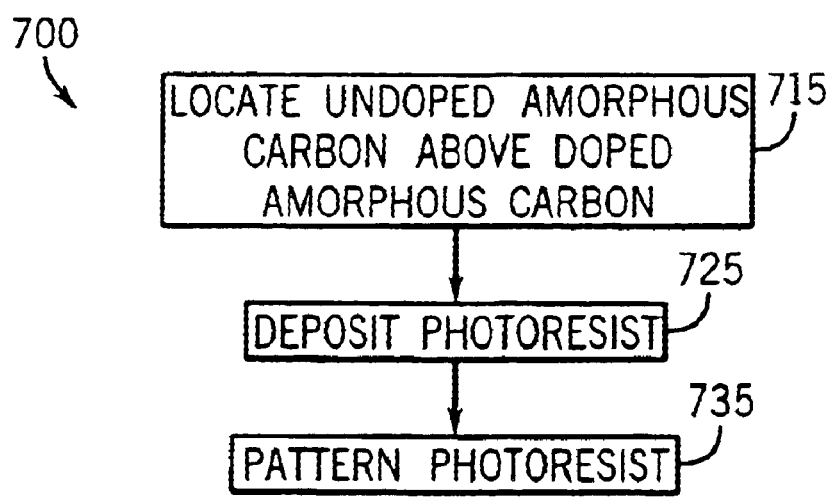
FIG. 7 is a flow diagram of exemplary operations in a method of forming reduced width trenches.

FIG. 7 illustrates a flow diagram 700 depicting exemplary steps and a method of forming reduced width trenches. Flow diagram 700 illustrates by way of example, some steps that may be performed. Additional steps, fewer steps, or combinations of steps may be utilized in various different embodiments.

In an exemplary embodiment, in a step 715, an undoped amorphous carbon layer is provided above a doped amorphous carbon layer. A variety of different techniques may be used to apply the undoped amorphous carbon layer above the doped amorphous carbon layer, such as chemical vapor deposition. One application operation is described with reference to FIG. 1 where the undoped amorphous layer is provided above an oxide layer located between the undoped amorphous layer and the doped amorphous layer. Another application operation is described with reference to FIG. 4 where the undoped amorphous layer is provided below an oxide layer located between the undoped amorphous layer and the doped amorphous layer.

In a step 725, a photoresist layer is provided above the undoped amorphous carbon layer and the doped amorphous carbon layer. The photoresist layer can be provided using a variety of techniques. One exemplary photoresist application operation is described with reference to FIG. 2. Another photoresist application operation is described with reference to FIG. 5.

The photoresist layer and the doped amorphous carbon layer are separated by an oxide layer as well as an undoped amorphous carbon layer. Advantageously, the undoped amorphous carbon layer helps prevent photoresist poisoning in the photoresist layer.

In a step 735, the photoresist layer is patterned to form features. Any of a variety of different patterning steps may be used to form the apertures in the photoresist layer, such as UV exposure and aqueous alkaline development. One photoresist patterning operation is described with reference to FIG. 3. Another photoresist patterning operation is described with reference to FIG. 6.

While the exemplary embodiments illustrated in the figures and described above are presently preferred, it should be understood that these embodiments are offered by way of example only. Other embodiments may include, for example, a different basic layer instead of amorphous carbon. The invention is not limited to a particular embodiment, but extends to various modifications, combinations, and permutations that nevertheless fall within the scope and spirit of the appended claims.

What is claimed is:

1. A method of using an amorphous carbon layer to prevent photoresist poisoning, the method comprising:

doping a first amorphous carbon layer located above a substrate;

providing an oxide layer above the first amorphous carbon layer, the oxide layer containing a defect;

providing a second amorphous carbon layer adjacent to the oxide layer, wherein the second amorphous carbon layer is undoped and the second amorphous carbon layer helps prevent photoresist poisoning, wherein doping a first amorphous carbon layer includes providing a dopant containing nitrogen to enhance etch resistance.

2. The method of claim 1, wherein the second amorphous carbon layer is located between the oxide layer and the first amorphous carbon layer.

3. The method of claim 1, wherein the second amorphous carbon layer is located above the oxide layer.

4. The method of claim 1, wherein the second amorphous carbon layer has a thickness of approximately 100 Angstroms.

5. The method of claim 1, wherein the first amorphous carbon layer has a thickness of approximately 600 Angstroms.

6. A method of using an amorphous carbon layer to prevent photoresist poisoning, the method comprising:

doping a first amorphous carbon layer located above a substrate;

providing an oxide layer above the first amorphous carbon layer, the oxide layer containing a defect;

providing a second amorphous carbon layer adjacent to the oxide layer, wherein the second amorphous carbon layer is undoped and the second amorphous carbon layer helps prevent photoresist poisoning, wherein the oxide layer includes SiON.

7. The method of claim 1, wherein the oxide layer has a thickness of 200–250 Angstroms.

8. A method of using an amorphous carbon layer to prevent photoresist poisoning the method comprising:

doping a first amorphous carbon layer located above a substrate;

providing an oxide layer above the first amorphous carbon layer, the oxide layer containing a defect;

providing a second amorphous carbon layer adjacent to the oxide layer, wherein the second amorphous carbon layer is undoped and the second amorphous carbon layer helps prevent photoresist poisoning, wherein doping a first amorphous carbon layer includes providing a nitrogen doping to enhance etch resistance.

9. The method of claim 1, providing a photoresist layer above the oxide layer.

10. A method of preventing photoresist poisoning using an undoped amorphous carbon layer, the method comprising:
   providing a doped amorphous carbon layer above a substrate;
   providing a SiON layer above the doped amorphous carbon layer; and
   providing an undoped amorphous carbon layer above the doped amorphous carbon layer.

11. The method of claim 10, wherein the substrate includes a polysilicon layer.

12. The method of claim 11, wherein the undoped amorphous carbon layer is above the oxide layer.

13. The method of claim 10, wherein the undoped amorphous carbon layer has a thickness less than 100 Angstroms.

14. The method of claim 10, further comprising providing a photoresist layer above the SiON layer.

15. A method of preventing resist poisoning, the method comprising:
   providing a doped basic layer above a substrate, the doped basic layer including amorphous carbon doped with at least nitrogen;
   providing an oxide layer above the doped basic layer; and
   forming an undoped layer along the oxide layer.

16. The method of claim 15, wherein the undoped layer is formed along an upper side of the oxide layer.

17. The method of claim 15, wherein the undoped layer is formed along a bottom side of the oxide layer.

18. The method of claim 15, wherein the doped layer is doped amorphous carbon.

19. The method of claim 15, wherein the undoped layer has a thickness of 100 Angstroms or less.

20. The method of claim 15, further comprising depositing and patterning a photoresist layer and using the patterned photoresist layer in a gate formation operation involving the doped basic layer.

* * * * *